United States Patent
Park et al.

(10) Patent No.: US 7,573,014 B2
(45) Date of Patent: Aug. 11, 2009

(54) IMAGE SENSOR WITH WELL REGIONS OF DIFFERENT DEPTHS AND METHOD OF FABRICATION THEREOF

(75) Inventors: Young-Hoon Park, Suwon-si (KR); Tae-Seok Oh, Seoul (KR); Eun-Soo Kim, Seongnam-si (KR); June-Taeg Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/119,562

(22) Filed: May 13, 2008

(65) Prior Publication Data

US 2008/0251697 A1      Oct. 16, 2008

Related U.S. Application Data

(62) Division of application No. 11/336,906, filed on Jan. 23, 2006, now Pat. No. 7,504,614.

(30) Foreign Application Priority Data

Jan. 25, 2005    (KR) .................. 10-2005-0006837

(51) Int. Cl.
*H01L 27/00* (2006.01)
*G01J 3/50* (2006.01)

(52) U.S. Cl. .................................... 250/208.1; 250/226

(58) Field of Classification Search .............. 250/208.1, 250/226, 214.1; 257/440; 358/513, 514; 348/272–277; 430/57.2, 57.7, 57.4, 46
See application file for complete search history.

(56) References Cited

U.S. PATENT DOCUMENTS

| | | | |
|---|---|---|---|
| 5,965,875 A * | 10/1999 | Merrill | 250/226 |
| 6,534,759 B1 * | 3/2003 | Koscielniak et al. | 250/214.1 |
| 6,548,833 B1 * | 4/2003 | Lin et al. | 257/89 |
| 7,061,028 B2 | 6/2006 | Yaung et al. | |
| 7,193,289 B2 | 3/2007 | Adkisson et al. | |
| 2004/0140564 A1 | 7/2004 | Lee et al. | |
| 2004/0241899 A1 | 12/2004 | Brissot et al. | |
| 2004/0251395 A1 * | 12/2004 | Takahashi et al. | 250/208.1 |
| 2005/0088551 A1 | 4/2005 | Lee et al. | |

FOREIGN PATENT DOCUMENTS

| | | |
|---|---|---|
| JP | 07043517 | 2/1995 |
| JP | 2002184965 | 6/2002 |
| KR | 1020010061339 A | 7/2001 |
| KR | 1020020052800 A | 7/2002 |
| KR | 1020030002881 A | 1/2003 |

* cited by examiner

*Primary Examiner*—Que T Le
*Assistant Examiner*—Pascal M Bui-Pho
(74) *Attorney, Agent, or Firm*—Volentine & Whitt, PLLC

(57) ABSTRACT

Disclosed is an image sensor and method of fabricating the same. The image sensor includes a photoelectric transformation region formed in a semiconductor substrate, and pluralities of interlayer dielectric films formed over the photoelectric transformation regions. The interlayer dielectric films contain multilevel interconnection layers. A color filter layer is disposed in a well region formed in the interlayer dielectric films over the photoelectric transformation region. A passivation layer is interposed between the color filter layer and the interlayer dielectric films.

10 Claims, 12 Drawing Sheets

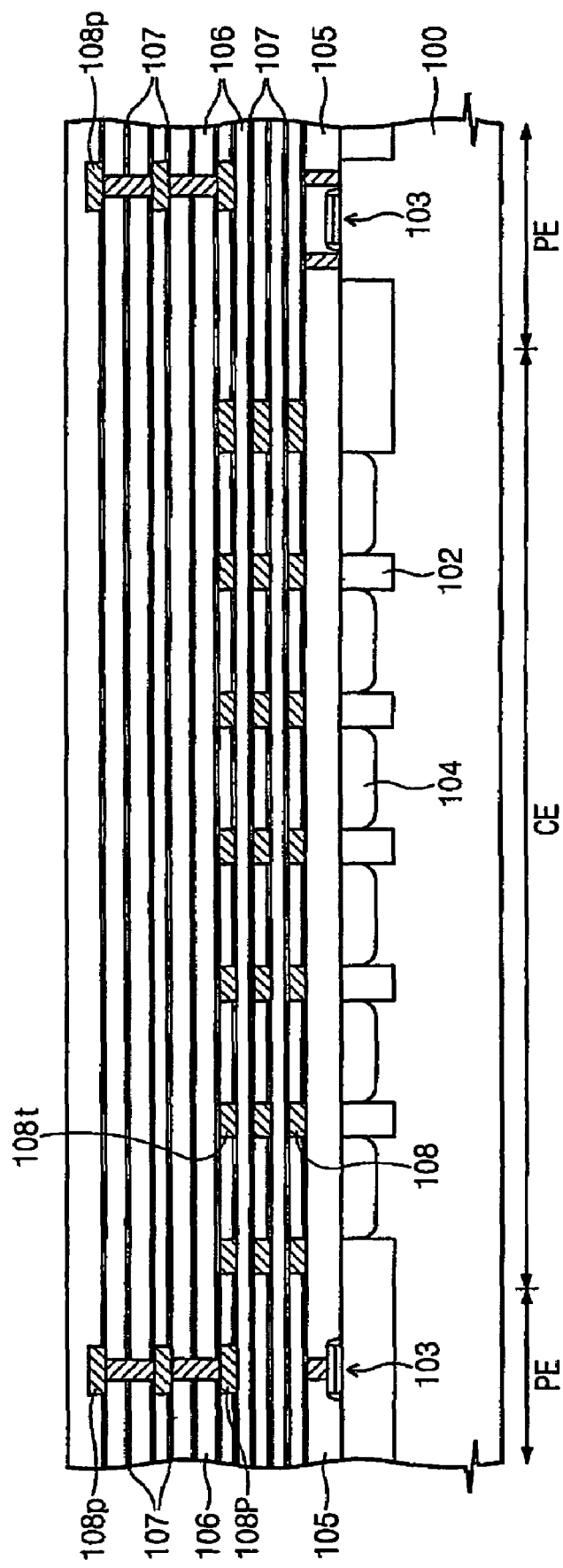

IMAGE SENSOR WITH WELL REGIONS OF DIFFERENT DEPTHS AND METHOD OF FABRICATION THEREOF

CROSS REFERENCE TO RELATED APPLICATION

This is a divisional of U.S. application Ser. No. 11/336,906, filed Jan. 23, 2006, which is incorporated herein by reference in its entirety.

BACKGROUND OF THE INVENTION

1. Field of the Invention

Embodiments of the invention relate to image sensors. More particularly, embodiments of the invention relate to an image sensor having improved optical sensitivity and a related method of fabrication.

2. Discussion of Background Art

Image sensors convert incident light into corresponding electrical signals (e.g., digital data) which may subsequently be used to form still or moving images. The term "incident light" generally refers to optical energy of any reasonable wavelength received by an image sensor. Conventional image sensors are basically composed of a pixel array. The pixel array is formed in turn by a uniform arrangement of photoelectric transformation regions, such as photodiodes. In order to detect, process, and output electrical signals having a color content, the conventional image sensor typically includes one or more color filter layers disposed on the pixel array. The color filter layers resolve the incident light (e.g., externally provided natural light) into various colored components, each having a specific wavelength (or range of wavelengths).

In one common implementation, the color filter layer is composed of various pluralities of color filters. Conventional color filters are generally classified into red-green-blue (RGB) color filters that resolve incident light into the primary colors; red (R), green (G), and blue (B), and complementary color filters that resolves incident light into the four colors of cyan (C), yellow (Y), green (G), and magenta (M). In a color filter layer comprising various pluralities of color filters, each color filter is adapted to communicate only a specific wavelength of light from the incident light to one or more corresponding photoelectric transformation region(s).

FIG. 1A is a plane view of a conventional image sensor principally illustrating a constituent pixel array. FIG. 1B is a related sectional view taken along with the line I-I' of FIG. 1A.

Referring to FIGS. 1A and 1B, the pixel array of the conventional image sensor comprises a plurality of pixels arranged in two dimensions (e.g., an X/Y plane arrangement). Each pixel is defined by field isolation regions 12 formed in a semiconductor substrate 10. Each pixel includes a photoelectric transformation region 14 formed in the semiconductor substrate 10 by which incident light is converted into electrical signals. Although not shown, each pixel also comprises conventionally understood connection circuits adapted to output the electrical signals resulting from the conversion of incident light by the photoelectric transformation region 14.

A protection film 15 is formed on the resulting array of photoelectric transformation regions 14. A stacked plurality of interlayer dielectric films 16 is then formed on protection layer 15. Various pixel array interconnections, 18 and 18t, associated with the foregoing connection circuits are generally formed in relation to interlayer dielectric films 16. For example, interconnections 18 and 18t may be formed using multilevel interconnection techniques. In the illustrated example, the upper interconnection 18t may be formed with a lattice structure designed to selectively expose the photoelectric transformation region. That is, the upper interconnection may be designed to cover the peripheral portions (e.g., the edges) of the constituent photoelectric transformation regions to thereby function as a light shielding layer that protects the photoelectric transformation regions from exposure to undesired light beyond the intended incident light (e.g., incident light from a defined field of view). Such undesired light acts a noise signal to the intended incident light.

Color filter layers 20 are formed on an upper interlayer dielectric film 16, and are respectively disposed over photoelectric transformation regions 14 of the pixel array. Within this configuration, each color filter 20 may optically select light at a specific wavelength from the incident light and communicate it to a corresponding photoelectric transformation region 14. A protection film 22 is formed on color filter layers 20 to prevent damage to the color filter layers 20 during later stages of the manufacturing process. Microscopic lenses 24 are then disposed one for one over the respective color filter layers 20.

In order to produce high-quality images, the effective optical sensitivity of the photoelectric transformation regions 14 to light incident must be improved. As illustrated in FIGS. 1A and 1B, light communicated from color filter layers 20 must pass through a plurality of interlayer dielectric films 16 in the conventional image sensor in order to reach a photoelectric transformation region 14. As the various interlayer dielectric films 16 contain materials having different refractive indexes, optical interference arises from a multiplicity of light signals variously refracted and reflected at, for example, surface interfaces between the individual interlayer dielectric films 16. This optical interference causes a loss the effective throughput of the desired incident light. Further, since each interlayer dielectric film 16 has its own absorption coefficient, a decrease in the intensity of the incident light inevitably occurs along the optical path between the color filters 20 and the photoelectric transformation regions 14. These two phenomenon are further exacerbated in the conventional image sensor by the effects of errant optical noise signals (e.g., stray incident light communicated through microscopic lenses 24 at some undesired refracted angle). Such errant optical noise signals may impact and reflect from multilevel interconnections 18 and 18t or otherwise abnormally progress through the vertical structure of the image sensor towards the photoelectric transformation regions.

SUMMARY OF THE INVENTION

Accordingly, embodiments of the invention are directed to an image sensor adapted to reduce the optical loss of incident light in relation to photoelectric transformation regions of the image sensor. Stated in positive terms, embodiments of the invention are directed to an image sensor adapted to increase the quantity (e.g., the intensity) of incident light received by photoelectric transformation regions of the image sensor. Embodiments of the invention are also directed to related methods of fabricating such an image sensor.

In one embodiment of the invention, an image sensor is provided with a reduced number of interlayer insulation films associated with color filter layers and photoelectric transformation regions.

Thus, in one embodiment, the invention provides an image sensor comprising; a photoelectric transformation region formed in a semiconductor substrate, a stacked interconnection element formed proximate to a peripheral portion of the photoelectric transformation region, the stacked interconnection element comprising a stacked plurality of interlayer dielectric films, wherein each interlayer dielectric layer comprises an interconnection layer, a color filter layer formed in relation to the stacked interconnection element on the photoelectric transformation region, a passivation layer interposed between the color filter layer and the stacked interconnection element, and a microscopic lens formed on the color filter layer.

In another embodiment, the invention provides an image sensor comprising; pixel array and peripheral circuit regions defined in a semiconductor substrate, a plurality of photoelectric transformation regions formed in the pixel array region, a first plurality of interlayer dielectric films formed over the peripheral circuit region, wherein each interlayer dielectric layer comprises an interconnection layer, wherein each one of the plurality of photoelectric transformation regions has associated therewith, a stacked interconnection element formed proximate to a peripheral portion of the photoelectric transformation region, wherein each stacked interconnection element is formed from a second plurality of the interlayer dielectric films less than the first plurality, a color filter layer formed in relation to the stacked interconnection element on the photoelectric transformation region, a passivation layer interposed between the color filter layer and the stacked interconnection element, and a microscopic lens formed on the color filter layer.

In yet another embodiment, the invention provides a method of fabricating an image sensor, comprising; forming a photoelectric transformation region in a semiconductor substrate, forming a stacked plurality of interlayer dielectric films on the photoelectric transformation region, wherein each one of the interlayer dielectric films comprises an interconnection layer and wherein one of the interconnection layers provided by the stacked plurality of interlayer dielectric films comprises a light shielding layer, patterning the stacked plurality of interlayer dielectric films to form a well region over the photoelectric transformation region in alignment with the light shielding layer, forming a passivation layer conformably over the well region, filling the well region with a color filter layer, and forming a microscopic lens on the color filter layer.

BRIEF DESCRIPTION OF THE DRAWINGS

Several embodiments of the invention are described with reference to the accompanying drawings. In the drawings and corresponding portions of the specification, like numerals refer to like or similar elements. In the drawings, the thickness and relative size of various layers and regions may be exaggerated for clarity. In the drawings.

DESCRIPTION OF EXEMPLARY EMBODIMENTS

Several embodiments of the invention will be described below in some additional detail with reference to the accompanying drawings. The present invention may, however, be embodied in different forms and should not be constructed as being limited to only the embodiments set forth herein. Rather, these embodiments are presented as teaching examples. It will also be understood from the following description that when a layer (or film), or element is referred to as being "on" another layer (or film), element, or substrate, it may be "directly on" the other layer (or film), element, or substrate, or intervening layers (or films) or elements may also be present.

Figure 1A:
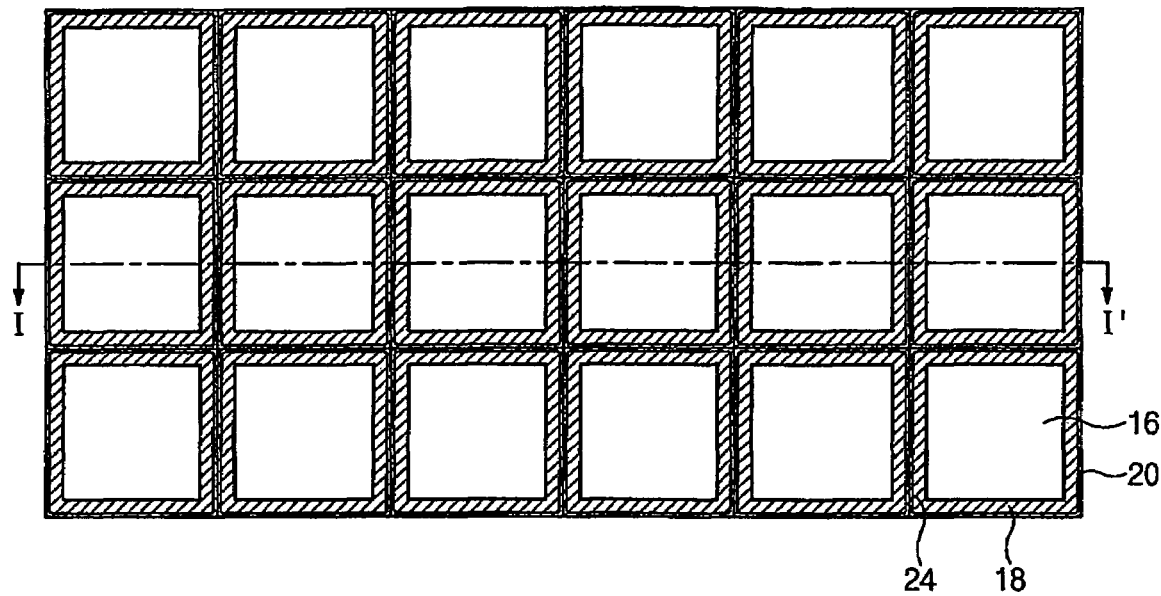
FIG. 1A is a plane view of a conventional image sensor.
Figure 1B:
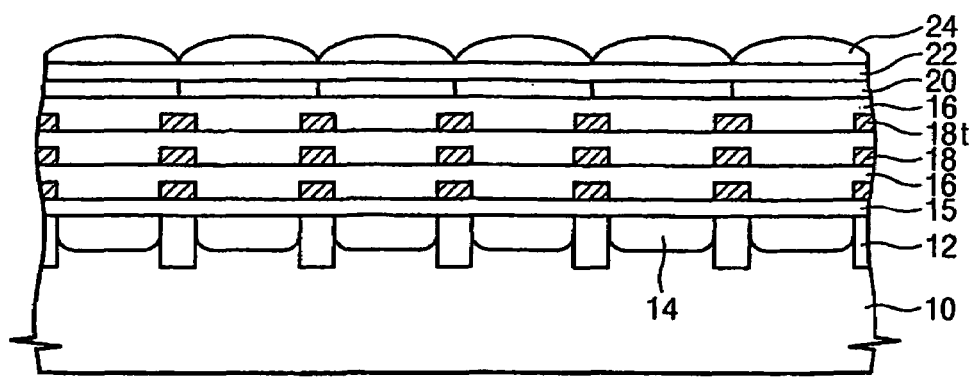
FIG. 1B is a sectional view taken along with the line I-I' of FIG. 1A.
Figure 2:
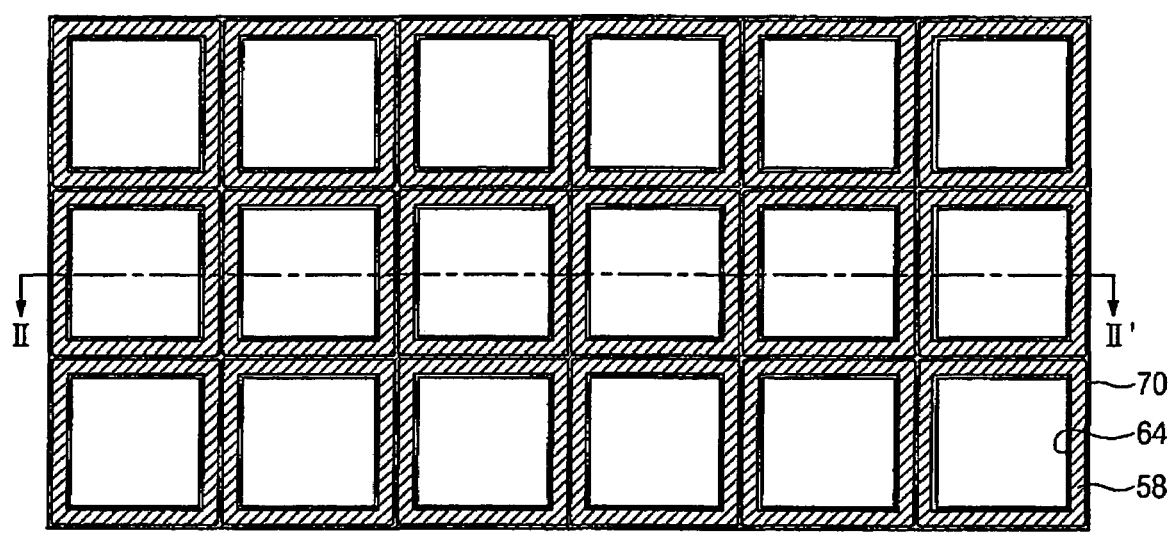
FIG. 2 is a plane view illustrating an image sensor in accordance with a first embodiment of the invention.
Figure 3A:
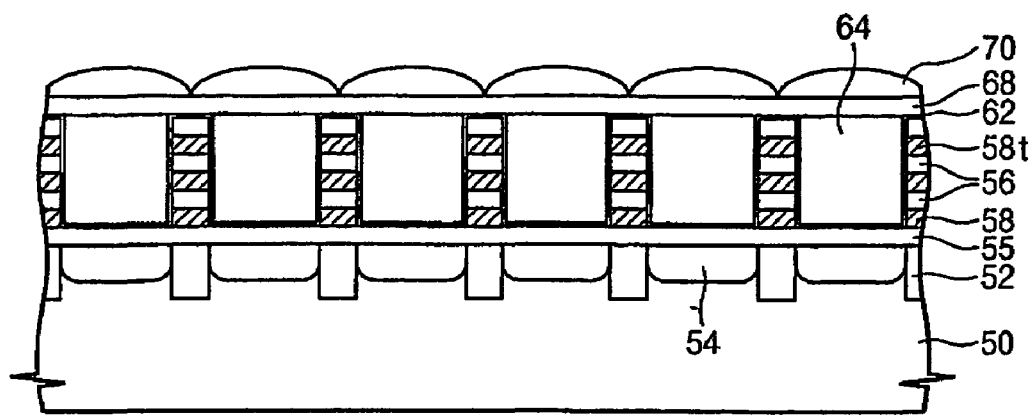
FIG. 3A is a sectional view taken along with the line II-II' of FIG. 2.

FIG. 2 is a plane view illustrating an image sensor in accordance with a first embodiment of the invention. FIG. 3A is a related sectional view taken along with the line II-II' of FIG. 2.

With reference to FIGS. 2 and 3A, field isolation regions 52 are formed in a semiconductor substrate 50 to define pixel regions of a pixel array. Photoelectric transformation regions 54 are formed using conventional techniques and arranged within the pixel array. Photoelectric transformation regions 54 may be variously formed so long as they essentially provide conversion of incident light to electrical signals. However, in one embodiment, photoelectric transformation regions 54 are formed of photodiodes. Although not shown here for the sake of clarity, each pixel further comprises of a conventional local connection circuit adapted to provide the electrical signals generated from the incident light in response to a selection signal.

The exemplary pixel array further comprises multilevel interconnection layers 58 and 58t. A number of interlayer dielectric films 56 are formed on substrate 50, such that the multilevel interconnection layer, 58 and 58t, are interposed between interlayer dielectric films 56.

An upper multilevel interconnection layer 58t also functions as a light shielding layer. That is, light shielding layer 58t may be formed as a lattice structure on peripherals portions of the photoelectric transformation regions 54, enabling effective communication of desired incident light to the photoelectric transformation regions 54. One example of the latticed structure of light shielding layer 58t may be seen from the plane view of FIG. 2. As a matter of course, the light shielding layer 58t may serve a dual purpose as an interconnection layer adapted to transfer electrical signals from the photoelectric transformation regions 54.

Color filter layers 64 are respectively formed on the photoelectric transformation regions 54. In one embodiment, color filter layers 64 are constructed to in-fill a well region formed by sidewall portions of peripherally located (with respect to a photoelectric transformation regions 54) "stacked interconnection elements." In the illustrated example, the stacked interconnection element is formed from an stack of interlayer dielectric layers 56 each comprising various interconnection layers, including interconnection layer(s) 58 and light shielding layers 58t. Alternatively, the stacked interconnection elements may be formed from an alternating stack of interlayer dielectric films 56 and patterned metallization layers formed interconnection layers 58 and 58t. In one embodiment, the lattice structure of light shielding layers 58t may be used to define the peripheral geometry of the stacked interconnection elements around the photoelectric transformation regions 54.

Before formation of color filter layers 64, however, a passivation film 62 may be conformably formed on the resulting structure of the stacked interconnection elements formed on substrate 50. In particular, passivation film 62 covers the sidewall portions of the stacked interconnection elements, including the edge boundaries between contacting interlayer dielectric films 56 and multilevel interconnection layers 58 and 58t, in order to prevent infiltration of impurities or moisture. Passivation film 62 may be formed to cover the entire well region in which color filter layers 64 are formed and may this constitute an optical waveguide structure. That is, passivation layer 62 will serve in some embodiments of the invention as an optical waveguide structure channeling incident light through a color filter layer 64 and preventing any lateral migration of incident light between adjacent pixels in the array, thereby reducing optical noise in the image sensor. This configuration also increases the amount of incident light reaching the photoelectric transformation regions 54 and greatly reduces the negative refractive effects associated with the multiple layer boundaries noted in the conventional image sensor configuration.

In one embodiment, passivation film 62 is formed from a material having a high refractive index relative to the color filter layers 64, so as to induce the positive channeling (e.g., reflection) effects above, even in relation to optical signals having small incident angles at the boundary between color filter layers 64 and passivation film 62. However, it should be noted that passivation film 62 is optional to embodiments of the invention, as even without passivation film 62, the color filter layers 64 may be made from a material having a sufficiently low refractive index such that "total reflection" (e.g., the optical channeling effect) from the sidewalls of the stacked interconnection elements accomplished the desired results.

Also, a shield insulation film 55 may be provided between color filter layers 64 (or passivation film 62) and photoelectric transformation regions 54. Shield insulation film 55 prevents damages to photoelectric transformation regions 54 during fabrication of the image sensor. Otherwise, damage to photoelectric transformation regions 54 may result on generation of dark currents and other noise signals.

Respective microscopic lens 70 may be arranged on each color filter layer 64. Microscopic lenses 70 may be formed from a polyimide resin or a silicon oxide film, for example. In some embodiments, it may be beneficial to form a surface-flattening protection film 68 between microscopic lenses 70 and color filter layers 64. In one embodiment the respective microscopic lenses 70 are formed with a planar surface area (e.g., the X/Y area shown in FIG. 2) greater than the planar surface area of a corresponding color filter layer 64. In other words, it is desirable for the border of the microscopic lenses 70 to be located over the light shielding layer 58t so as to effectively orient incident light through the microscopic lens 70 towards a corresponding photoelectric transformation region 54.

An exemplary method adapted to fabricate the image sensor illustrated in FIGS. 2 and 3A will be described in some additional detail with respect to FIGS. 3B through 3E which are related sectional views.

Figure 3B:
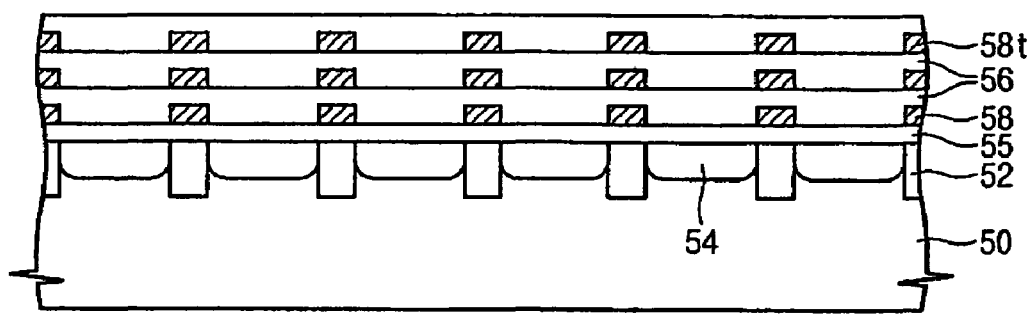
FIGS. 3B through 3E are sectional views illustrating processing steps for fabricating the image sensor by the first embodiment of the invention.

First, referring to FIG. 3B, field isolation regions 52 are formed in the semiconductor substrate 50, thereby defining pixel regions in the pixel array of the image sensor. Respective photoelectric transformation regions 54 are then formed in each pixel region. Interlayer dielectric films 56 are then formed on substrate 50. However, shield insulation film 55 may optionally be formed on substrate 50 following formation of photoelectric transformation regions 54, but before formation of the first interlayer dielectric film 56. In one embodiment, shield insulation film 55, as formed from an appropriate material, may function as a first interlayer dielectric film.

In the illustrated example multilevel interconnection layers, 58 and 58t, are formed within the interlayer dielectric films 56. The stacked combination of interlayer dielectric films 56, each comprising one or more multilevel interconnection layers (e.g., 58 and 58t), serve to electrically connect photoelectric transformation regions 54 to local circuits in a conventionally understood manner.

An upper multilevel interconnection layer, (e.g., element 58t), may function as the light shielding layer. Light shielding layers 58t may be constructed in the form of a lattice being arranged on the peripheral portions of the photoelectric transformation regions 54.

Figure 3C:
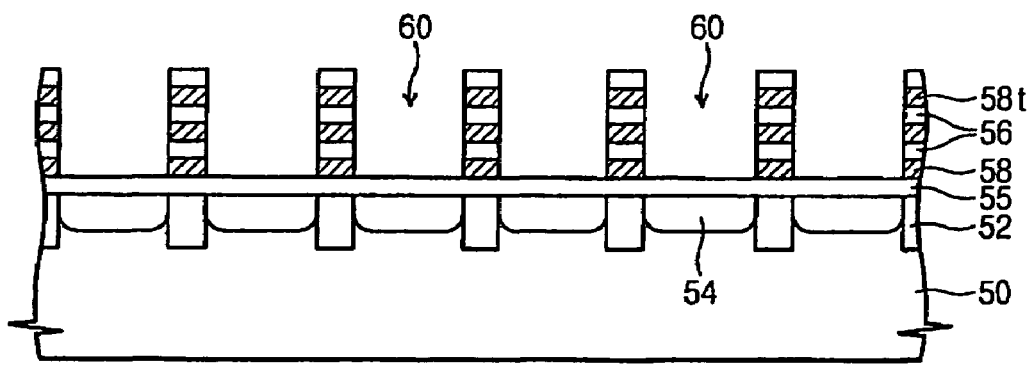

Referring to FIG. 3C, the stacked plurality of interlayer dielectric films 56 are selectively patterned to form respective well regions 60 over a corresponding photoelectric transformation region 54. Shield insulation film 55 may be used as an etch stop down to photoelectric transformation regions 54, thus preventing damage to photoelectric transformation regions 54. Well regions 60 may be formed in one embodiment by etching the interlayer dielectric films 56 using a self-alignment technique using light shielding layers 58t as a etch mask. Alternatively, the interlayer dielectric films 56 may be selectively etched using one or more patterned photoresist films formed in relation to light shielding layers 58t or in relation to some defined portion of the respective pixel regions.

In an embodiment where selective etching of interlayer dielectric films 56 is accomplished using either one or more photoresist films formed in relation to light shielding layer 58t, or light shielding layer 58t itself, well regions 60 may be formed using self-aligned techniques such that the outer sidewall portions of well regions 60 are aligned with sidewalls of the light shielding layers 58t. Thus, the pattern of light shielding layers 58t may be utilized as the etch mask even in circumstances where some degree of misalignment occurs between a formed photoresist film and light shielding layers 58t. Further, well regions 60 may be formed to precisely expose a desired portion of each pixel region through the stacked interlayer dielectric films 56. As a result, well regions 60 are aligned within openings defined by the lattice structure of light shielding layers 58t, are accurately settled over the photoelectric transformation regions 54. In one embodiment, the selective formation of well regions 60 defines the stacked interconnection structures around the peripheral portions of each pixel.

Figure 3D:
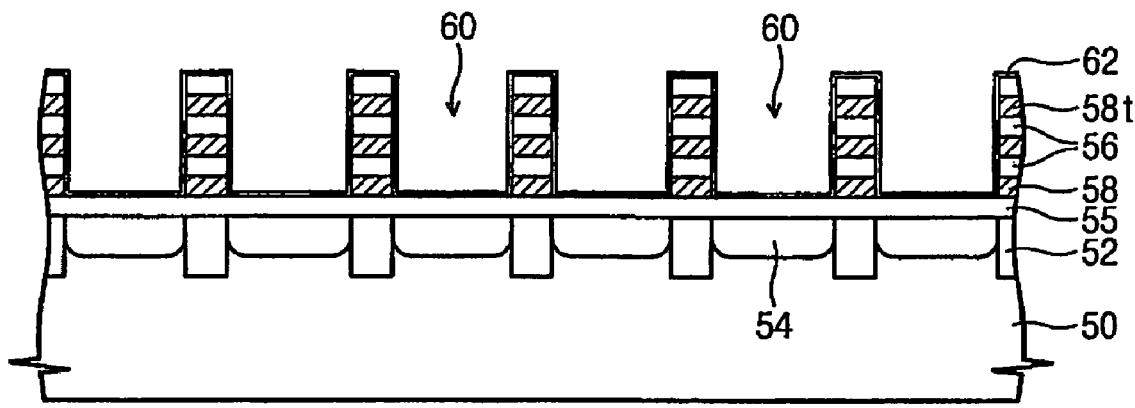

Referring to FIG. 3D, passivation film 62 is conformably formed over the resulting structure on substrate 50, and within well regions 60. In particular, passivation film 62 is deposited on the inner walls of well regions 60 thereby covering the interconnection boundaries between interlayer dielectric films 56 and multilevel interconnection layers 58 and 58t. In one embodiment, passivation film 62 is formed from a material having a relatively low light absorption coefficient and a relatively low refractive index relative to color filter layers 64 to be formed in well regions 60.

Figure 3E:
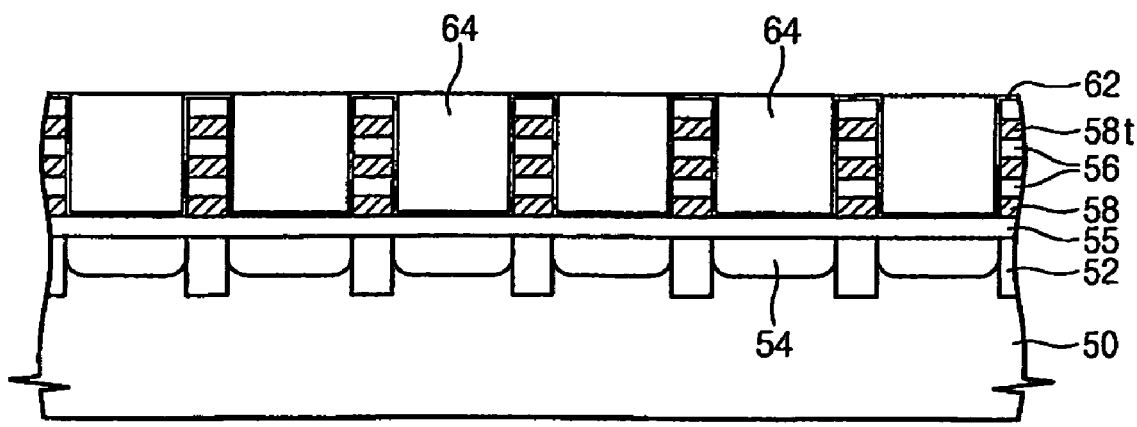

Referring to FIG. 3E, well regions 60 are filled with color filter layers 64, each adapted to selectively communicate light having a specific wavelength. In one embodiment, color filter layers 64 are formed from a material having a refractive index higher than that of passivation film 62 so as to produce a total reflection channeling effect within color filter layer 64 between surfaces formed by passivation film 62. However, even without passivation film 62, color filter layers 64 may be formed from a material having a relatively higher refractive index than that of interlayer dielectric films 56, so as to provide the foregoing optical channeling effect.

Subsequent to the formation of color filter layers 64, the conventional microscopic lenses 70, as shown in FIG. 3A, may be formed in relation to the color filter layers 64. Surface-flattening protection film 68 may be further deposited on the color filter layers 64 before forming the microscopic lenses 64.

It should be noted at this point that different wavelengths have different optical responses to different materials. Thus, for any given choice of material used to form color filter layers 64, light having a wavelength associated with the color red will have a different optical response (e.g., penetration ability and optical absorption) than light having a wavelength associated with the color blue. Thus, the thickness with which color filter layers 64, as defined by the formation depth of corresponding well regions 60 may significantly impact the optical sensitivity of a particular, corresponding photoelectric transformation region 54. An additional embodiment of the invention will now be described the addresses this recognition.

FIGS. 4A through 4D are related sectional views illustrating a method adapted to the formation of an image sensor according to another embodiment of the invention.

Figure 4A:
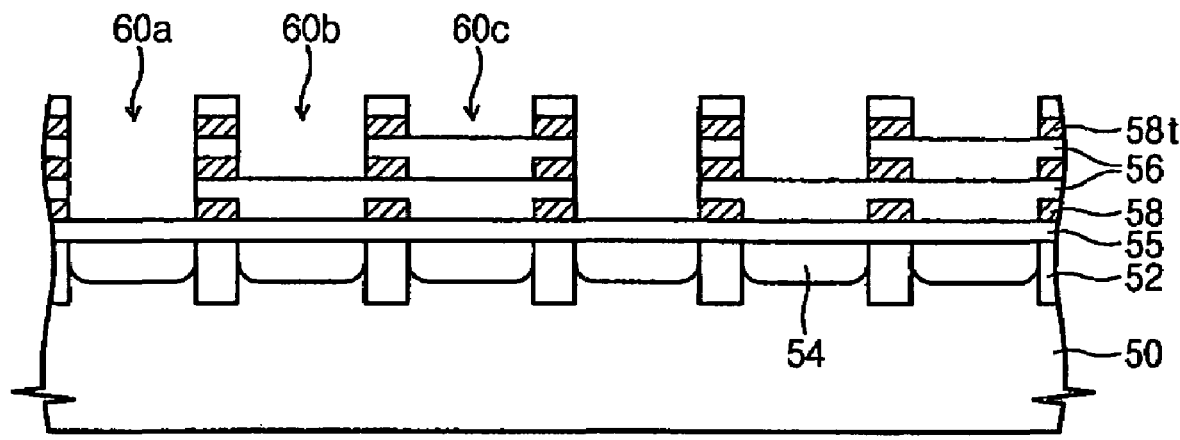
FIGS. 4A through 4D are sectional views illustrating an image sensor and processing steps for fabricating the same by a second embodiment of the invention.

Referring to FIG. 4A, respective well regions 60a, 60b, and 60c are formed to different depths. For example, if we assume that three (3) interlayer dielectric layers 56 are first formed on substrate 50, first well region 60a is formed by selectively etching all three interlayer dielectric layers 56, second well region 60b is formed by selectively etching the upper two interlayer dielectric layers 56, and third well region 60c is formed by selectively etching only the uppermost interlayer dielectric layer 56. However, even in this case, shield insulation film 55 may be provided to protect photoelectric transformation regions 54.

Figure 4B:
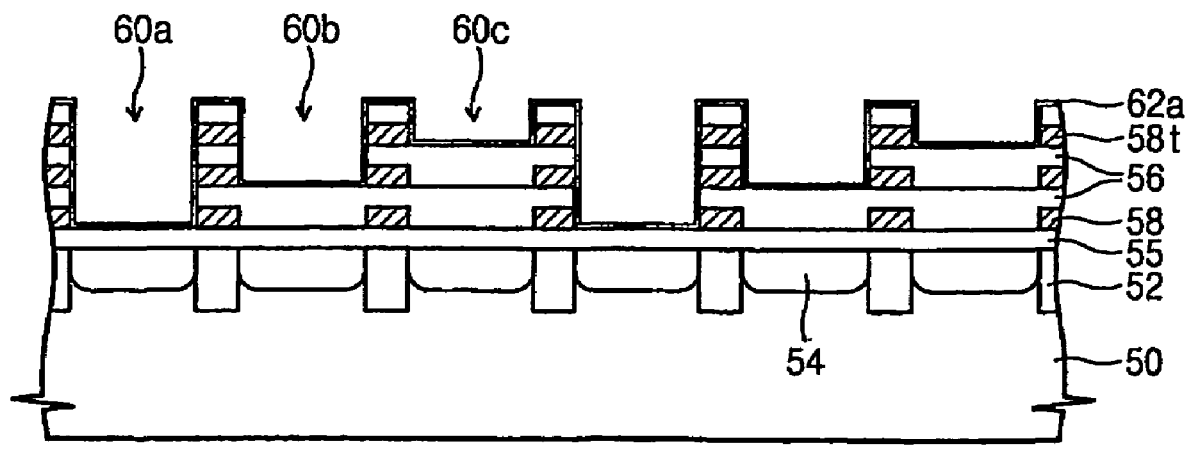

Thereafter, referring to FIG. 4B, passivation film 62a is conformably deposited over the resulting structure on substrate 50, including well regions 60a, 60b, and 60c.

Figure 4C:
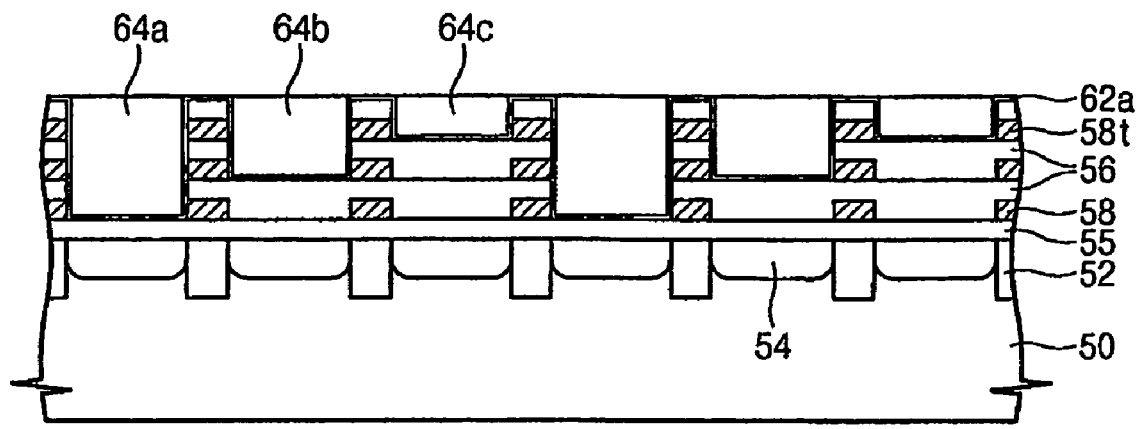

Referring to FIG. 4C, respective color filter layers, 64a, 64b, and 64c, are then formed to fill well regions 60a, 60b, and 60c. The deeper well regions and correspondingly thicker color filters are provided in relation to colors (e.g., blue) that have a relatively weak transmission ability. In contrast, the shallower well regions and correspondingly thinner color filters are provided in relation to colors (e.g., red) that have a relatively strong transmission ability. That is, an increasing thickness of absorbent dielectric material is left between the mircolens and photoelectric transformation region in stronger color pixels.

Figure 4D:
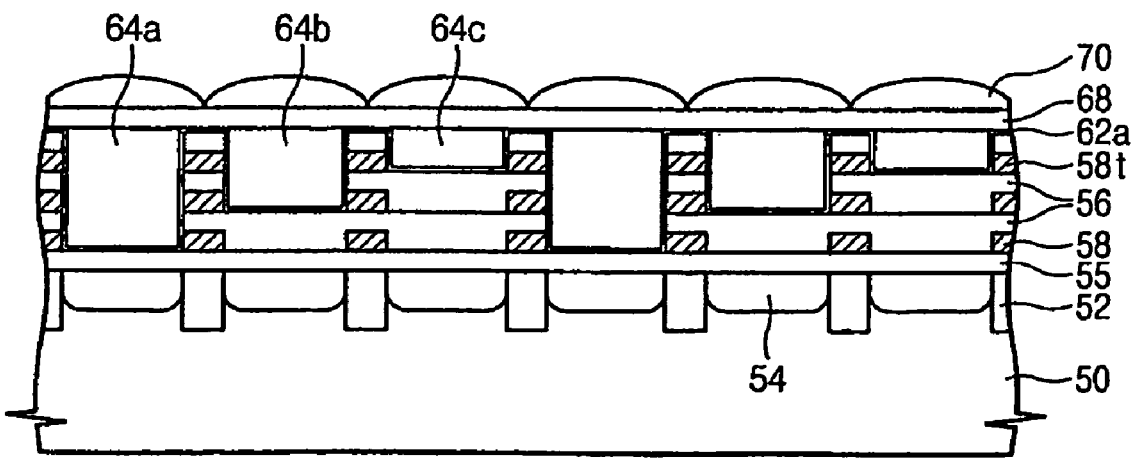

Referring to FIG. 4D, color filter layers 64a, 64b, and 64c are added as is (optionally) surface-flattening protection film 68 and the microscopic lenses 70.

Figure 5A:
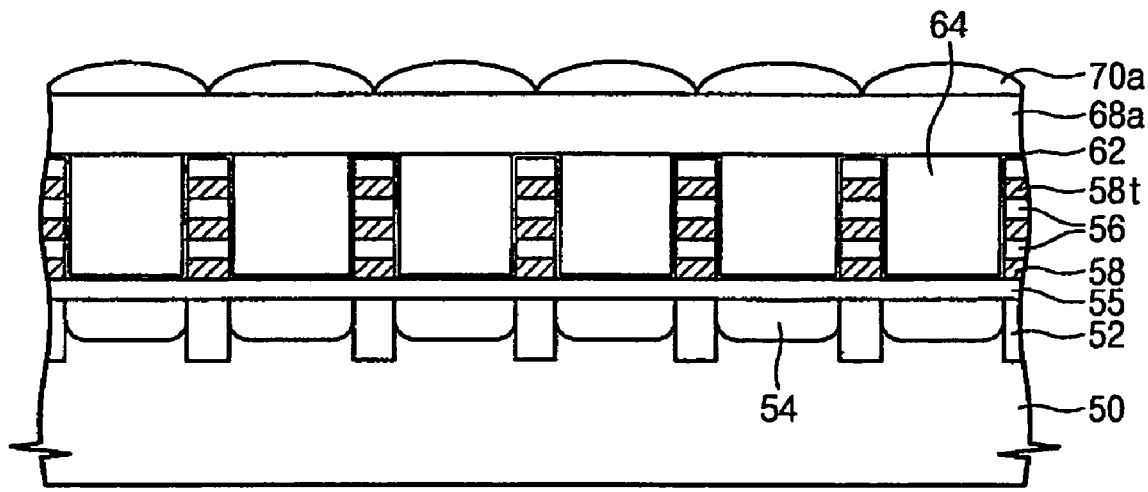
FIGS. 5A through 5B are sectional views illustrating an image sensor and processing steps for fabricating the same by a third embodiment of the invention; and, FIGS. 6A through 6E are sectional views illustrating an image sensor and processing steps for fabricating the same by a fourth embodiment of the invention.
Figure 5B:
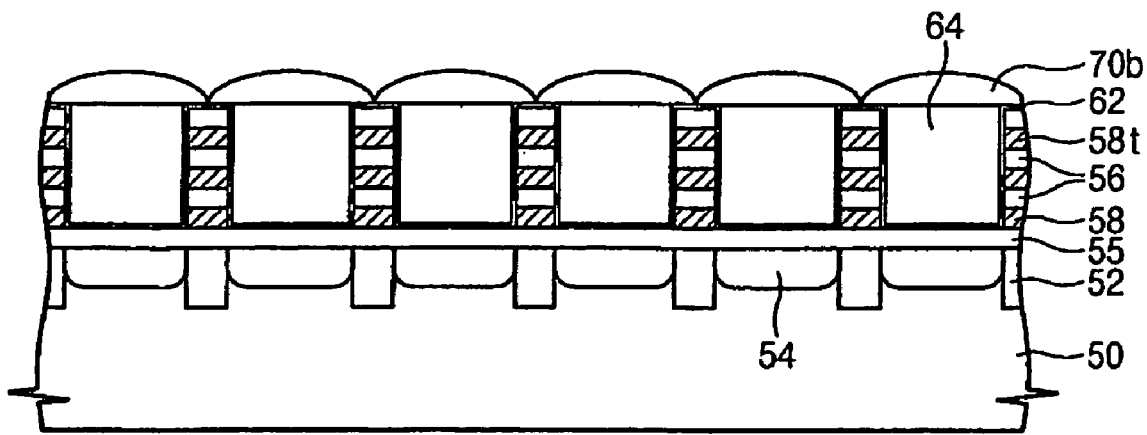

FIGS. 5A through 5B are sectional views illustrating an image sensor and a related method of fabrication according to another embodiment of the invention.

In general, microscopic lenses 70 within the foregoing image sensor embodiments may be conventionally formed by patterning and reflowing a polyimide resin or a low-temperature oxide (LTO) film. However, the following additional embodiment of the invention proposes another method of forming microscopic lenses 70.

Referring to FIG. 5A, after forming color filter layers 64 (or 64a, 64b, and 64c) having been formed in the foregoing exemplary embodiments, a surface-flattening protection film 68a is formed on the respective resulting structures including the color filter layers. Protection film 68a may be formed from a material having superior physical properties than polyimide resin or LTO, (e.g., a material having a high transmittance, a low dispersion effect, and high resistance to environmental stress, etc.). Thereafter, microscopic lenses 70a may be formed on protection film 68a using conventional methods.

Referring to FIG. 5B, microscopic lenses 70a and the protection film 68a are anisotropically etched. As a result, the curvature of microscopic lenses 70a is transcribed onto protection film 68a, thereby completing forming a final microscopic lense structure, 70b, from protection film 68a. In the illustrated embodiment of FIG. 5B, protection film 68a is etched until the bordering edges of microscopic lense 70b contact with passivation film 62. However, microscopic lenses of any reasonable thickness may be formed from protection film 68b.

FIGS. 6A through 6E are sectional views illustrating an image sensor and a related method of fabrication according to another embodiment of the invention. This embodiment may be useful for improving the optical sensitivity when a low-transmittance material layer is formed over the photoelectric transformation regions.

Referring to FIG. 6A, field isolation regions 102 are formed to define pixel regions within a pixel array region (CE) and peripheral circuit (PE) regions in a semiconductor substrate 100. Thereafter photoelectric transformation regions 104, such as photodiodes, are formed in the individual pixel regions. A number (a first plurality) of interlayer dielectric films 106 are then formed on semiconductor substrate 100, each interlayer dielectric layer 106 comprising one or more interconnection layers, (e.g., 108 and 108p).

Interconnection layers 108 in the pixel array field may, for example, be connected to transistors arranged in the pixel array (CE) region, while interconnection layers 108p may be connected to interconnection layers 108 or transistors arranged in the peripheral circuit region (PE). While the pixel array region comprises circuits adapted to select individual pixels, the peripheral circuit region comprises circuits adapted to generally drive the image sensor including the pixel array. Thus, the peripheral circuit region is typically constructed with a greater number of interconnection layers than are found in the pixel array region. As before noted, the uppermost interconnection layers, (e.g., 108t), may be used as a light shielding layer.

The multilevel interconnection layers 108 and 108p may be formed using a conventionally understood damascene process. Etch-stop layers 107 may be interposed between adjacent interlayer dielectric films 106 in order to protect lower interlevel interconnection films while patterning interlayer dielectric films 106 to form the multilevel interconnection layers 108. The etch-stop layers 107 may be formed from silicon oxide as generally used in conjunction with silicon nitride films. The silicon nitride film has a lower transmittance than the silicon oxide film. If the etch-stop layers 107 are interposed between adjacent interlayer dielectric films 106 for the multilevel interconnection layers 108, the intensity of light transmitting the interlayer dielectric films 106 and the etch-stop layers 107 is weakened, which may cause a reduction in the optical sensitivity of the image sensor.

Figure 6B:
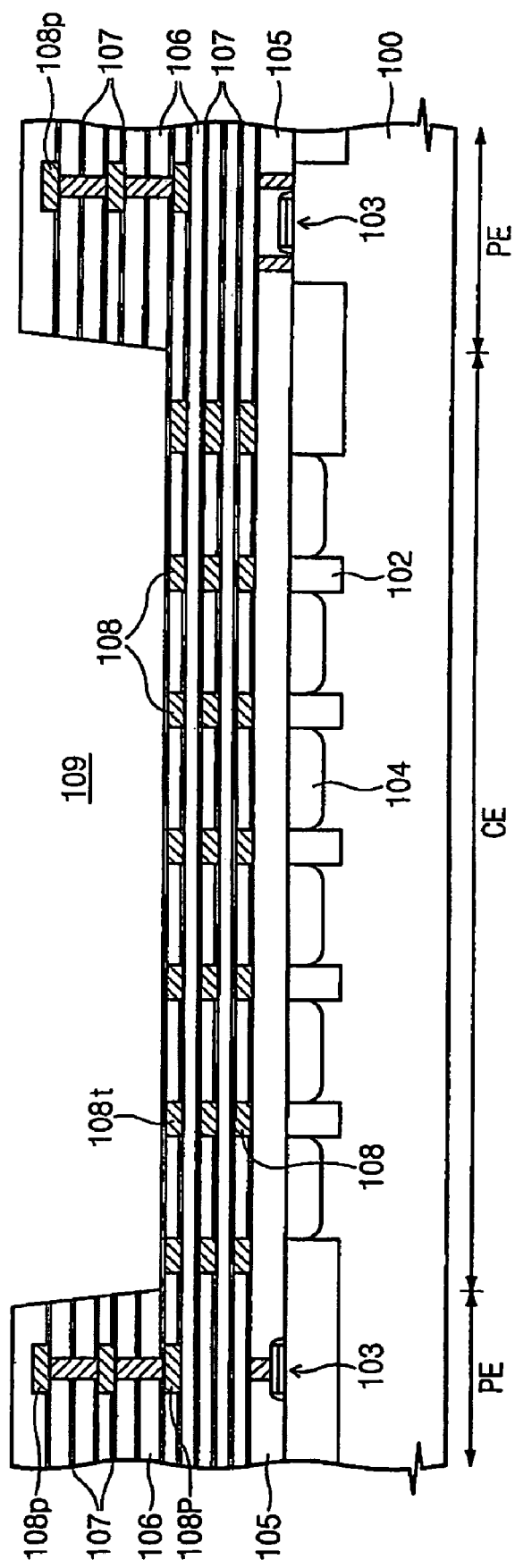

Next, referring to FIG. 6B, the first plurality of interlayer dielectric films 106 and the etch-stop layers 107 are removed in the pixel array region over the light shielding layers 108t to define a second plurality of interlayer dielectric films. As a result, a cavity 109 is formed in the pixel array region, being lower than the peripheral circuit region, which is helpful for reducing the thickness of the insulation film that covers the photoelectric transformation regions 104. Although not shown, a processing step of forming cavity 109 may be carried out after the formation of related bonding pads in the peripheral circuit region.

Figure 6C:
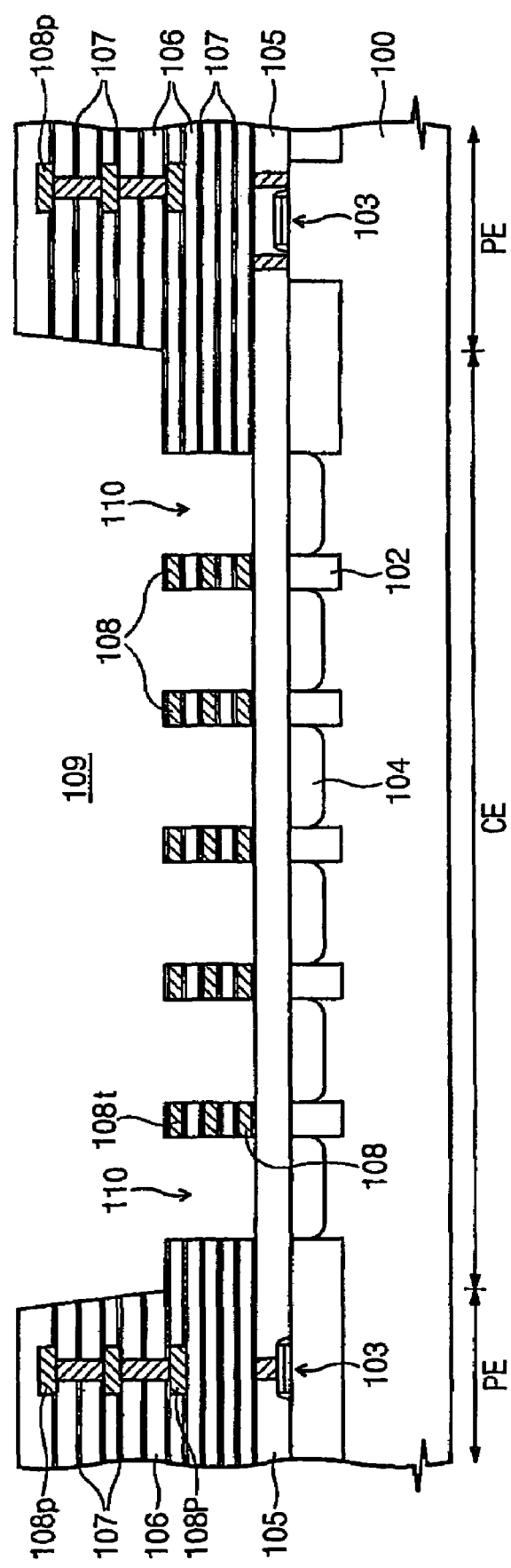

Referring to FIG. 6C, well regions 110 are then formed by selectively removing portions of the second plurality of interlayer dielectric films 106 and etch-stopping layers 107 in the pixel array region being aligned to light shielding layers 108t. As aforementioned through the former embodiments, light shielding layers 108t may be formed in a lattice structure defining well region openings. Thus, interlayer dielectric films 106 and etch-stopping layers 107 may be selectively removed using light shielding layers 108t as an etch mask, or by using a photoresist pattern defined in relation to light shielding layers 108t. Using either technique, peripheral circuit region may be effectively protected. Before forming interlayer dielectric films 106, a shield insulation film 105 may be further deposited to protect the photoelectric transformation regions 104. It is preferable in one embodiment that well regions 110 be formed such that shield insulation film 105 remains on the photoelectric transformation regions 104, thereby preventing the photoelectric transformation regions 104 from being damaged.

Figure 6D:
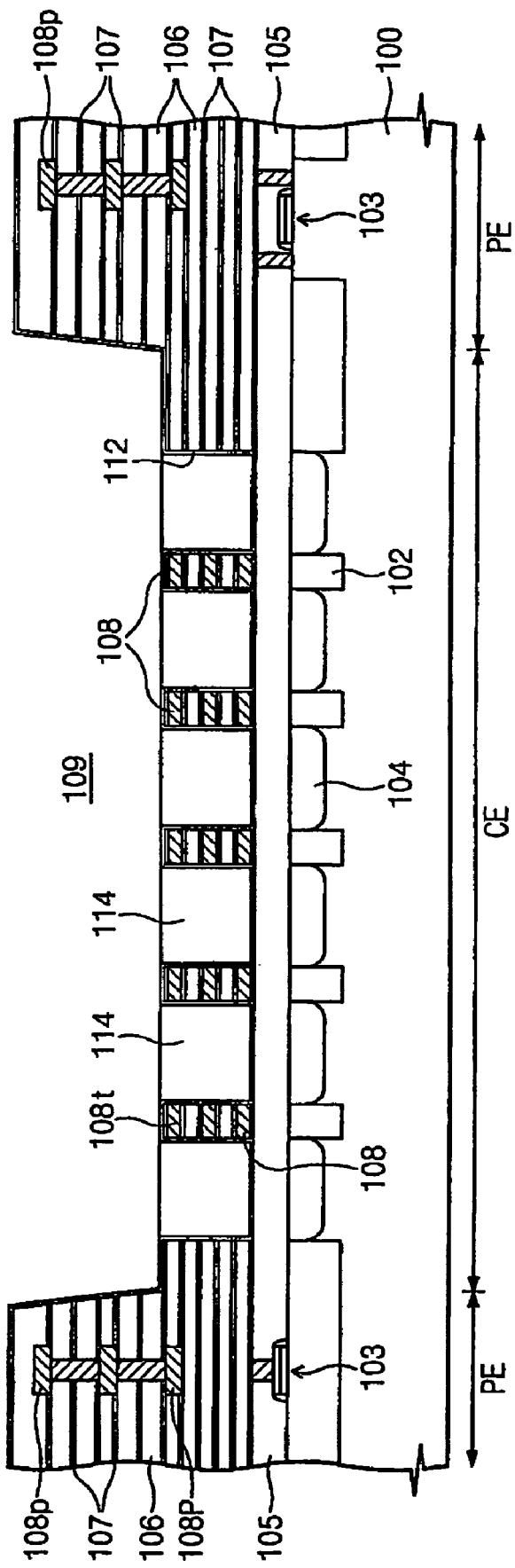

Thereafter, referring to FIG. 6D, color filter layers 114 are respectively formed within well regions 110. As with the former embodiment(s), well regions 110 may be formed with various depths in accordance with different kinds of color filter layers. And, a passivation layer may be conformably deposited over the substrate 100 including well regions 110, before forming the color filter layers 114. Passivation layer 112 is adapted to effect an optical waveguide structure surrounding sidewall portions of color filter layers 112. As above, passivation layer 112 may be formed from a material having a relatively lower refractive index than the color filter layers 114, so that the light communicated by the color filter layer is channeled as described above.

Figure 6E:
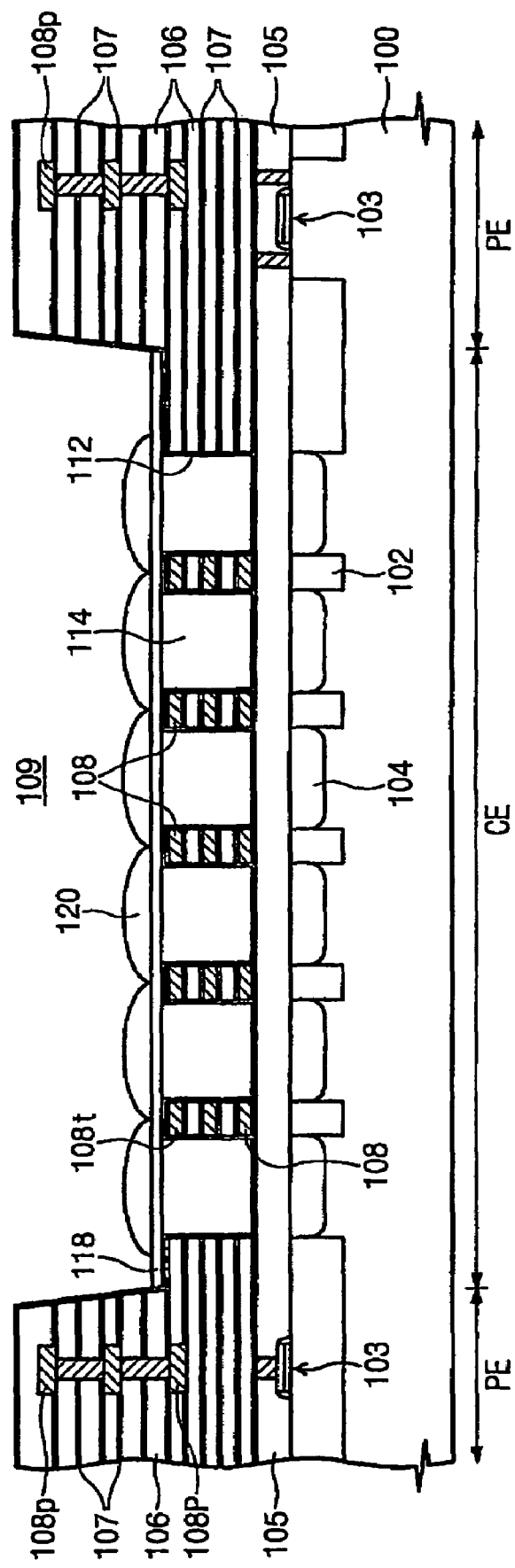

Referring to FIG. 6E, a surface-flattening protection film 118 is deposited over the pixel array region including color filter layers 114 and then microscopic lenses 120 are each formed rightly over color filter layers 114. Microscopic lenses 120 may be formed as described above.

According to this illustrative embodiment of the invention, cavity 109 over pixel array region is helpful in decreasing the number of the insulation layers stacked on the photoelectric transformation regions 104, and therefore eliminating low-transmittance insulation layers. Therefore, it is possible to raise the optical sensitivity of the image sensor, which becomes more effective owing to the structure that sidewalls of color filter layers 114 as aligned with sidewalls of light shielding layer 108t in the pixel array region.

According to the invention as variously described above, it is able to remarkably reduce the number of material layers (and associated intervening material) over photoelectric transformation regions to reduce optical loss of the desired incident light. Improve wavelength selectivity may also be accomplished by substituting the interlayer dielectric films with the color filter layers selectively transmitting specific wavelengths. Further, an optical waveguide function may be provided in relation to the color filter layers using a passivation layer, thereby further reducing the optical losses of incident light communicated through the color filter layers.

In addition, as the curvature of the microscopic lens pattern is transcribed to the lower film after forming the microscopic lens pattern, it is possible to complete the microscopic lenses of material with a high transmittance and endurance against external environments.

While the present invention has been described in connection with the embodiments of the invention illustrated in the accompanying drawings, it is not limited thereto. It will be apparent to those skilled in the art that various substitution, modifications and changes may be thereto without departing from the scope and of the invention as defined by the following claims.

What is claimed is:

1. An image sensor, comprising:
   a plurality of well regions comprising first, second and third well regions each respectively associated with and formed above a plurality of photoelectric transformation regions formed in a substrate;
   wherein each one of the plurality of well regions is formed between adjacent stacked interconnection elements comprising a plurality of dielectric layers respectively separating a plurality of stacked interconnection layers;
   wherein the first well region has a first depth, the second well region has a second depth less than the first depth, and the third well region has a third depth less than the second depth;
   a plurality of color filters comprising first, second and third color filters respectively formed in the first well region, second well region, and third well region;
   a continuous passivation layer separating the plurality of color filters from respective adjacent stacked interconnection elements; and
   a plurality of lens respectively formed over each one of the plurality of well regions,
   wherein the plurality of dielectric layers comprises N dielectric layers, and the first depth is defined by removal of M of the N dielectric layers in the first well region, the second depth is defined by removal of (M−1) of the N dielectric layers in the second well region, and the third depth is defined by removal of (M−2) of the N dielectric layers in the third well region.

2. The image sensor of claim 1, wherein the photoelectric transformation regions associated with the first, second and third color filters are respectively configured to transform different color light.

3. The image sensor of claim 1, further comprising:
   a shield insulation layer formed between each photoelectric transformation region and a lowermost one of the plurality of dielectric layers, wherein the shield insulation layer functions as an etch-stop layer when the lowermost one of the plurality of dielectric layers is removed by an etching process.

4. A method of fabricating an image sensor, comprising:
   forming a plurality of photoelectric transformation regions in a substrate;
   forming a shield insulation layer on an upper surface of the substrate over the plurality of photoelectric transformation regions;
   sequentially forming first, second and third dielectric layers on the shield insulation layer to respectively separate interconnection elements arranged at the periphery of each one of the plurality of photoelectric transformation regions, wherein a stacked combination of first, second and third dielectric layers and interconnection elements respectively defined first, second, and third well regions formed above the plurality of photoelectric transformation regions;

removing the first, second and third dielectric layers from the first well regions to define a first well having a first depth;

removing the second and third dielectric layers from the second well regions to define a second well having a second depth less than the first depth;

removing the third dielectric layer from the third well regions to define a third well having a third depth less than the second thickness; and forming a continuous passivation layer over the first, second and third wells and intervening stacked combinations of the first, second and third dielectric layers and interconnection elements.

5. The method of claim 4, wherein the shield insulation layer functions as an etch-stop layer when the first dielectric layer is removed by an etching process.

6. The method of claim 4, further comprising:

filling the first, second and third wells with a material having a higher refractive index than the plurality of dielectrics to respectively form first, second and third color filters having different thickness corresponding to the first, second, and third depths.

7. The method of claim 6, wherein the passivation layer is formed from a material having a relatively lower refractive index than the material used to form the first, second and third color filters.

8. The method of claim 7, wherein the passivation layer forms an optical waveguide on sidewall portions of the first, second and third well regions.

9. The method of claim 6, further comprising:

forming a plurality of microscopic lenses over the first, second and third color filters.

10. The method of claim 9, wherein forming the plurality of microscopic lenses comprises:

forming a protection film over the first, second and third color filters and intervening portions of the passivation layer covering an upper surface of the intervening stacked combinations of the first, second and third dielectric layers and interconnection elements;

respectively positioning a plurality of microscopic lenses having a defined curvature over the first, second and third color filters; and transcribing the defined curvature of the microscopic lenses by etching the protection layer using the passivation layer as an etch-stop layer.

* * * * *